United States Patent [19]

Gabr

[11] 4,342,002
[45] Jul. 27, 1982

[54] MODULAR ELECTRONIC SYSTEMS

[75] Inventor: Saad Z. M. Gabr, Canterbury, England

[73] Assignee: A.R.D. Anstalt, Vaduz, Liechtenstein

[21] Appl. No.: 119,646

[22] Filed: Feb. 8, 1980 (Under 37 CFR 1.47)

Related U.S. Application Data

[60] Division of Ser. No. 911,906, Jun. 2, 1978, Pat. No. 4,203,147, which is a division of Ser. No. 695,569, Jun. 14, 1976, Pat. No. 4,096,546, which is a continuation of Ser. No. 492,976, Jul. 26, 1974, abandoned.

[30] Foreign Application Priority Data

Aug. 2, 1973 [GB] United Kingdom ............... 36803/73
Aug. 10, 1973 [GB] United Kingdom ............... 37961/73
Aug. 24, 1973 [GB] United Kingdom ............... 40263/73
Sep. 20, 1973 [GB] United Kingdom ............... 44227/73

[51] Int. Cl.³ .............................................. H03F 1/00
[52] U.S. Cl. ........................................ 330/65; 361/394
[58] Field of Search ..................................... 330/65–68, 330/126, 202; 361/391, 394, 399, 415

[56] References Cited

U.S. PATENT DOCUMENTS 2,614,157 10/1952 Montgomery .................... 330/65 X

FOREIGN PATENT DOCUMENTS 2006734 8/1971 Fed. Rep. of Germany ........ 330/65

Primary Examiner—James B. Mullins
Attorney, Agent, or Firm—Young & Thompson

[57] ABSTRACT

An amplifier system comprises a plurality of modules located within a cabinet in a manner providing minimum signal paths. The signal to be amplified is divided into frequency ranges for main amplification, and each main amplifier has an independent power supply. The modules are constructed from extrusions shaped and assembled to facilitate servicing and to function as heat sinks or as a cooling system as well as to provide mechanical protection and electrostatic shielding.

7 Claims, 9 Drawing Figures

MODULAR ELECTRONIC SYSTEMS

This is a division of application Ser. No. 911,906, filed June 2, 1978, and now U.S. Pat. No. 4,203,147, which is a division of application Ser. No. 695,569, filed June 14, 1976, and now U.S. Pat. No. 4,096,546, which is a continuation of application Ser. No. 492,976, filed July 26, 1974, and now abandoned.

The invention relates to arrangements for mounting electric circuit elements and associated equipment, and to modular electronic systems built up therefrom with particular but not exclusive reference to modular high fidelity sound reproduction systems.

Electronic systems are now commonly made up from a variety of individual elements some of which are separate components and many of which are complete circuits or sub-circuits for example in card form, that is, in the form of a printed circuit card having circuit components, such as resistors, capacitors and transistors, secured thereto in appropriate locations, the card having connecting terminal portions along one edge for reception in a co-operating socket. An object of the invention is to provide improved arrangements for mounting these and other circuit elements within an electronic system.

Such individual elements have moreover to be operatively associated within the system. Thus in an amplifier input and control units have to be associated with the actual amplifier units. In addition, the system may be required physically to include mechanical or electromechanical equipment such as a record player deck, or a cartridge or cassette player. It is a further object of the invention to provide an improved layout for association of the elements, and another to provide improved mounting arrangements for associated mechanical equipment.

According to a first aspect of the invention, there is provided an amplifier system having signal input means at a first side wall of a cabinet, a preliminary signal treatment module or modules for conveying a signal or signals to be amplified adjacent a second, opposed, side wall of the cabinet, a plurality of amplifying modules having their inputs adjacent the second side wall and their outputs adjacent the first side wall, and signal output means at the first side wall.

According to a second aspect of the invention, there is provided a system for mounting electronic circuit cards comprising first and second elongated metal members of constant cross-section, the members being shaped for connection together to extend in parallel directions with substantial areas in contact and with a first web portion, a second web portion substantially at right angles to the first web portion, and a third web portion substantially parallel to the first web portion, the third web portion being arranged to support a circuit card to extend substantially parallel to and adjacent the first web portion.

According to a third aspect of the invention, there is provided a system for mounting at least one electronic circuit card, the system comprising a plurality of elongated metal members of constant cross-section, and a mounting element for the card, the metal members and the mounting element being connected together to provide mechanical protection for a card mounted by the element as well as electrostatic shielding, a heat sink and cooling means for electronic components of the card.

The invention will be readily understood from the following illustrative description and accompanying drawings, in which.

Figure 1:
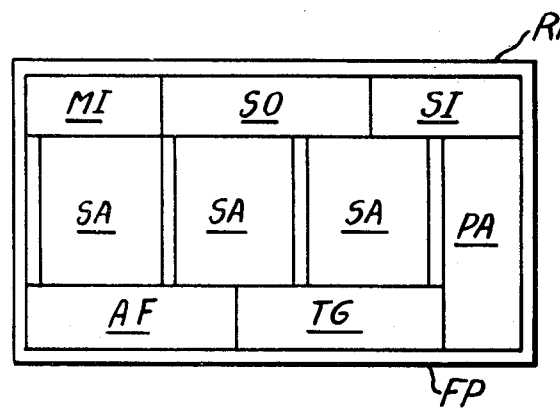
FIG. 1 is a schematic plan view of an amplifier system embodying the invention.

The amplifier system shown in FIG. 1 is disposed within a cabinet which is conveniently rectangular in plan, the first and second side walls being the rear and front walls or panels RP and FP respectively. Separate modules MI, SI and SO grouping together the mains inputs, the signal inputs, and the signal outputs are located at the rear wall panel and the controls are located at the front panel. The inputs are gathered together at one end of the rear panel and the preamplifier unit extends generally from front to rear of the cabinet at this end. The pre-amplifier PA controls may include a selector switch for selection from the various inputs (pickup, tape, tuner, etc.) and to avoid the necessity to bring all the input leads the entire depth of the cabinet from the rear input position to the pre-amplifier controls position, electronic switching is provided in the pre-amplifier module and remotely controlled from the front panel. Thus the actual length of the input leads is only from the input connections at the rear panel to the pre-amplifier card. Only a pair of leads, one for each stereo channel, extend from the pre-amplifier module into the rest of the system.

The pre-amplifier module may accommodate a single stereo pre-amplifier card or more than one monophonic amplifier cards.

The amplifier system illustrated divides the signal to be amplified into preferably three frequency ranges each dealt with by a respective amplifier module with an output to a respective loudspeaker means. An advantage of this arrangement is the increased flexibility obtained in the correction of reproduction patterns. Such a system also eliminates the need for loudspeaker crossover networks, which can give rise to power losses of up to 20%, and cause distortion as a result of the large capacitive and inductive elements in such circuits. The system can thus comprise a plurality of like modules. Each module is advantageously supplied with its own power transformer, to time-share the power supply as the emphasis of the signal varies between the frequency ranges and to reduce stray magnetic and electrostatic fields by permitting alternate phase connection of the primaries. The use of like readily replaceable modules facilitates location of the signal path within a cabinet for the system so as to minimize the length of the path and permits a star earthing system to be employed.

Thus a multi-channel high fidelity stereo sound reproduction system may comprise for each stereo channel a pre-amplifier supplying an outlet to a tone and gain control unit which in turn feeds a filter unit by which the incoming signal is divided into two or more frequency bands. Preferably three frequency bands are employed for example below 300 Hz, 300–3,000 Hz, and 3,000 to 30,000 Hz. It is however equally possible to divide the input signal into four or more frequency bands. Only a single such channel would be provided for monophonic reproduction and four channels would be used for quadrophonic reproduction.

If three frequency bands are employed, the cabinet will include three stereo amplifier modules, each handling a respective one of the frequency bands, comprising two amplifier printed circuit cards and a rectifier or regulated power supply card. Each module is associated with its own respective power transformer. The device therefore comprises several separate transformers each supplying power for a respective module, rather than a single larger transformer supplying all the modules. The advantages of this are two-fold. The adverse effects of stray magnetic fields from the transformers are reduced by alternating the phase connections of the transformer primaries to the mains supply, so that half the transformer primaries are 180° out of phase with the other half. There is consequently a substantial reduction in the stray fields from the transformers, which is of course additionally minimised by careful magnetic shielding. Secondly, it will be evident that the power drawn from the transformers supplying the amplifier modules will depend on the amplitude of the signals being amplified. When music is being reproduced, the various channels will not be handling signals of equal or uniform amplitude. Thus during a passage in which the bass is predominant, substantial power will be drawn through the transformer and rectifier supplying the low frequency module but little current will be drawn through the transformers and rectifiers feeding the middle and upper register modules. When the emphasis of the music changes, say to the upper registor, the transformer associated with the upper register module will then be supplying most power whilst the bass and middle register transformers will be supplying much less current. Only rarely will all three transformers be supplying substantial power together. Thus instead of more or less uniformly stressing a single large transformer, the arrangement provides for distribution of the stress with time over a plurality of smaller tranformers, so that the load is shared, with evident savings in weight and cost, and improved overloading characteristics. Moreover, there is the manufacturing advantage that only a single type of transformer need be kept in stock, although a variety of systems is being produced. However it is of course possible to use a power source located externally of the cabinet thereby avoiding stray magnetic fields. Such an external source can be of any suitable kind and may comprise a single transformer with a plurality of secondary windings each supplying a respective one or more of the modules.

Returning to FIG. 1, each channel of the selected input after pre-amplification is conveyed along the inner side of the front panel F to a tone and gain control module TG carrying adjustable controls and switching whence it goes to an active filter module AF for division into the desired number of frequency bands. The stereo signals for each frequency band are then fed from the front panel to the appropriate stereo amplifier module SA, the amplifier modules being arranged to extend in the general direction from the front to the rear of the cabinet. The amplifier output leads thus do not have far to extend from the amplifier modules to the output connections located at the rear panel. The signal path through the cabinet can thus be seen to be a sort of U-shaped loop beginning at one side of the rear panel extending forwardly and across the front panel and then rearwardly back to the rear panel, for connection to the appropriate loudspeakers. By this arrangement, the length of signal carrying leads between the various modules is reduced to a minimum.

Also in accordance with the invention, multi-input power amplifier cards and modules can be employed each being arranged to handle more than one frequency band or certain sections of a frequency band or both.

For example, a lower frequency band of up to 300 Hz could be divided into the signal sections, the first, say, up to 100 Hz and the second from 100 up to 300 Hz. The two signals can be fed into one twin input module accommodating a twin input power amplifier card which energizes a respective loudspeaker drive unit. This arrangement allows any appropriate correction of the reproduction pattern of the loudspeaker to be made, and in particular provides a convenient and simple means for boosting the lower end of the lower frequency band. Power amplifier cards and modules having any number of inputs can be used to deal with parts of one frequency band, or with several frequency bands. The signals from the preamplifiers, whether these are located in the cabinet or externally may be fed directly to the power amplifier modules or through other kinds of functional modules permitting level control of each of the inputs to the multi-input power amplifier modules and cards. Such arrangements are well suited to industrial sound amplification and distribution systems as well as to less conventional or standard high fidelity sound reproduction systems.

Also in accordance with the invention there is provided for mounting electric circuit elements, a family of elongated members of constant cross-section, the members being arranged to be readily assembled with each other and with the electric elements in a variety of ways permitting convenient replacement and/or addition to the elements. The invention thus provides a plurality of chassis members for use in building electronic apparatus of any desired kind or size. The elongated chassis members are not only shaped for convenient interengagement with one another and with housing members such as wooden or plastics panels, but also to function efficiently as heat sinks for transistors and earthing means for the electric circuitry. As the chassis members have constant cross-section, they can conveniently be made by extrusion and will be referred to as extrusions below. It will be understood however that the invention is not limited to the members when made by extrusion only. Most conveniently, the members are made of aluminum but other metals can be employed and the invention is not limited to the use of conductive material for the members; where the intended use for the member makes this appropriate, insulating, for example plastics, material can be employed. The aluminum extrusion most conveniently employed may be left in its natural surface condition or may be given any suitable surface coating or finish; a matt black finish is advantageous for heat dispersal purposes. To further enhance heat dissipation the members can be provided with longitudinal flanges or ribbing; the latter can be arranged to improve the appearance of the external surfaces of the members and to render finger marks less noticeable. Where not specifically stated below, it is to be understood that all the extrusions mentioned can be modified by the addition of ribs and flanges as desired.

The family of elongated members illustrated in FIGS. 2-6 relates to extrusions for use in amplifying equipment comprising a power unit, selector and control elements, and an amplifier or more usually amplifiers, depending in number on whether the equipment is to be stereophonic or quadrophonic and how many separate amplifiers are to be used to power respective loudspeakers in each channel.

Figure 2:
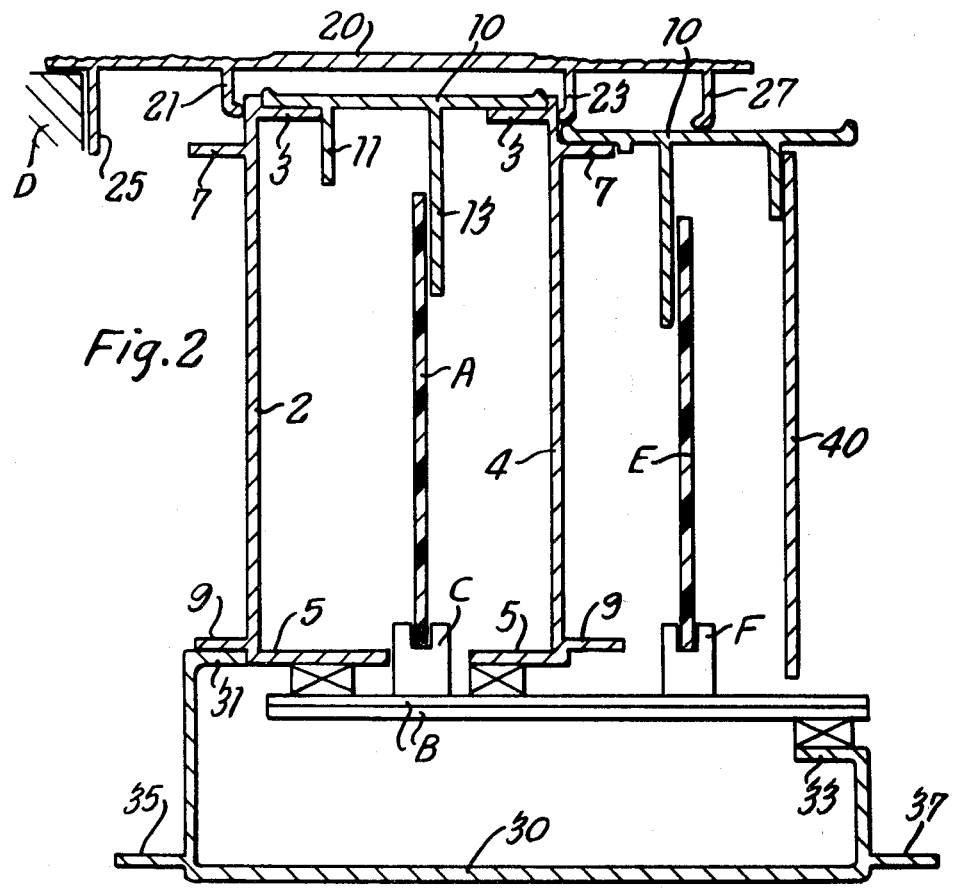
FIG. 2 is a sectional end view of a system embodying the invention for mounting electronic circuit cards.

The spine of the equipment illustrated in FIG. 2 comprises a pair of parallel like extrusions 2, 4 one turned relative to the other to provide inwardly projecting upper flanges 3 and lower flanges 5 and outwardly projecting upper flanges 7 and lower flanges 9. Just below the upper flange, a plurality of longitudnally extending ridges can be provided on the inner side to assist heat dissipation. The flanges 3 support longitudinal spaced lengths of an extrusion 10 from which unequal flanges 11, 13 extend downwardly. Circuit elements A of control and/or selector equipment are secured to these flanges 11, 13 and it will be seen that these elements are well shielded from elements outside the channel formed by the extrusions 2, 4. The floor of this channel is formed by printed circuit boards B mounting sockets C for these elements A. The extrusions 2, 4 can be made integrally by means of a connecting floor if desired but holes must be cut in the floor to receive the sockets.

Overlying the extrusion 10 is an extrusion 20 having downwardly extending flanges 21, 23 engaging the outer upper edges of the extrusions 2, 4. The main web of the extrusion 20 may be apertured to receive push buttons and/or knobs associated with the circuit elements carried by the extrusions 10. The extrusion 20 can but need not extend laterally on either or both sides to beyond an outer pair of downwardly extending flanges 25, 27 for co-operating engagement with a wooden panel D.

A channel shaped base extrusion 30 has an inturned flange 31, on which rests the flange 9, and a lower internal flange 33 which mounts the circuit boards B. External flanges 35, 37 are provided for mounting the extrusion 30.

Figure 3:
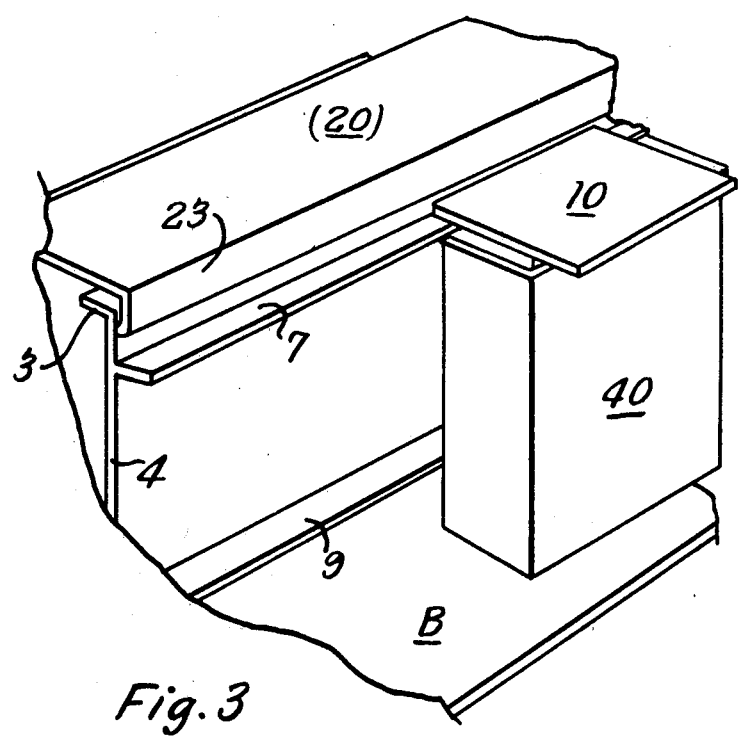
FIG. 3 is a perspective view of the system of FIG. 2.
Figure 4:
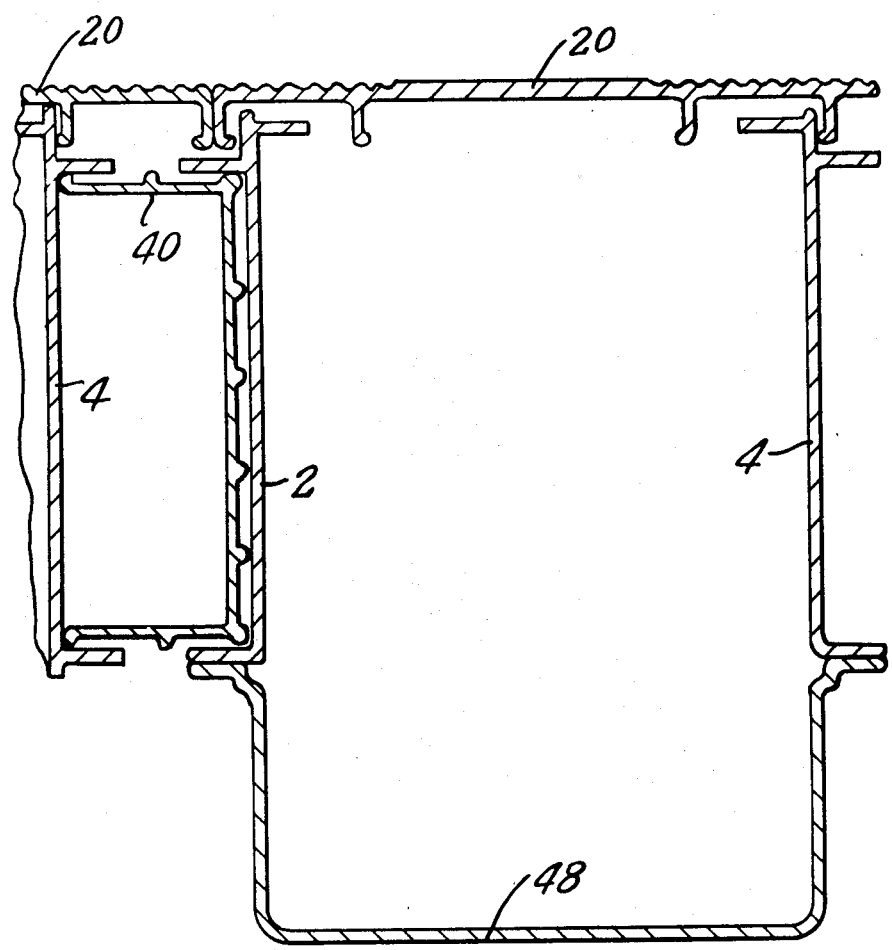
FIG. 4 is a sectional end view of a second system embodying the invention for mounting a power unit.

The flange 7 also supports a second extrusion 10 from which is suspended an amplifier circuit element E received in a socket F on the board B. The element E is shielded by a U-shaped extrusion 40 (FIGS. 3 and 4). As will be seen, the lower end of the extrusion 40 is spaced from the board B to allow for a cooling air flow around the element E. Where appropriate, output transistors can be mounted on the exposed upper surface of the main web of the extrusion 10. The various extrusions are secured together by bolts (not shown) extending through an overlapping flange into a tapped hole in the flange below.

In the complete equipment, as many of the amplifier elements E as are required are located on one or both sides of the extrusions 2, 4. For example if the equipment is to be stereophonic and to use a pair of loudspeaker units each having four loudspeakers in separate sub-compartments, eight amplifiers are required, four for each channel, one for each loudspeaker. A smoothing capacitor forming part of a separate power supply provision for each amplifier can be located between adjacent extrusions 40. Pre-amplifier equipment can be located between the extrusions 2, 4 and so can control and selector apparatus. Alternatively, the latter equipment can be mounted between a portion of the extrusions 2, 4 extending at right angles to the portion associated with the amplifiers. The rest of the power unit including the mains transformer can be located in adjacent extrusions, for example, as shown in FIG. 4, the extrusions 2, 4 can be joined by a symmetrical channel shaped base extrusion 48.

It is in accordance with the invention to produce the stereo amplifier module in such a way that all the cards of the module are on one longitudinal axis, and in this case the mechanical construction may be in one or other of the following forms:

(a) Only two long extrusions, instead of four are located along the sides. The extrusions must be long enough to accommodate the total lengths of the cards of the module.

(b) The extrusion forming the two sides of the module may be divided into sections according to the number of cards involved, in such a way that every card will have its own channel, mechanically and electrically independent of each other.

Figure 6A:
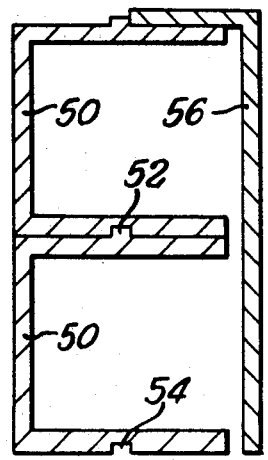
FIGS. 6A and 6B are like views of alternative further systems embodying the invention.

The pre-amplifier and tone and gain control modules have, like the amplifier modules, aluminum extrusions which provide shielding and heat dissipation. As shown in FIG. 6A, each module has a pair of like generally U-shaped channels 50 provided with an external ridge 52 on one limb and a co-operating external groove 54 on the other so that the two channels can be placed together to form a generally E-shaped double channel for accommodating respectively leads and components at mains voltage and frequency and those carrying the signal to be amplified. A generally L-shaped extrusion 56 engages the upper limb of the E-shaped channels, the free end of the shorter limb being in engagement with the exposed ridge of one of the U-shaped extrusions and the longer limb being spaced from the free ends of the U-shaped extrusions to avoid the formation of a closed tube.

Figure 6B:
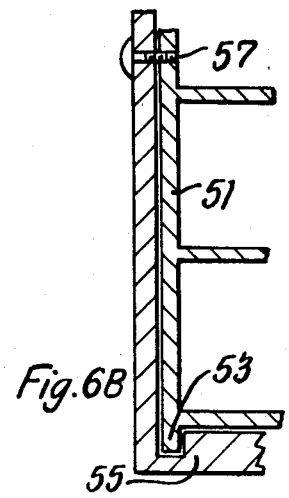

In a modification of the arrangements of FIG. 6A, shown in FIG. 6B, the two extrusions 50 are replaced by a single generally E-shaped extrusion 51, the centre limb of which may be omitted having short portions of the stem extending beyond the upper and lower side limbs. The lower extension portion 53 can be received in a groove in the cabinet base 55 and the assembly secured by one or more bolts 57 in holes in the upper extension. Removal of these bolts allows the assembly to be simply lifted out of the cabinet.

Figure 5:
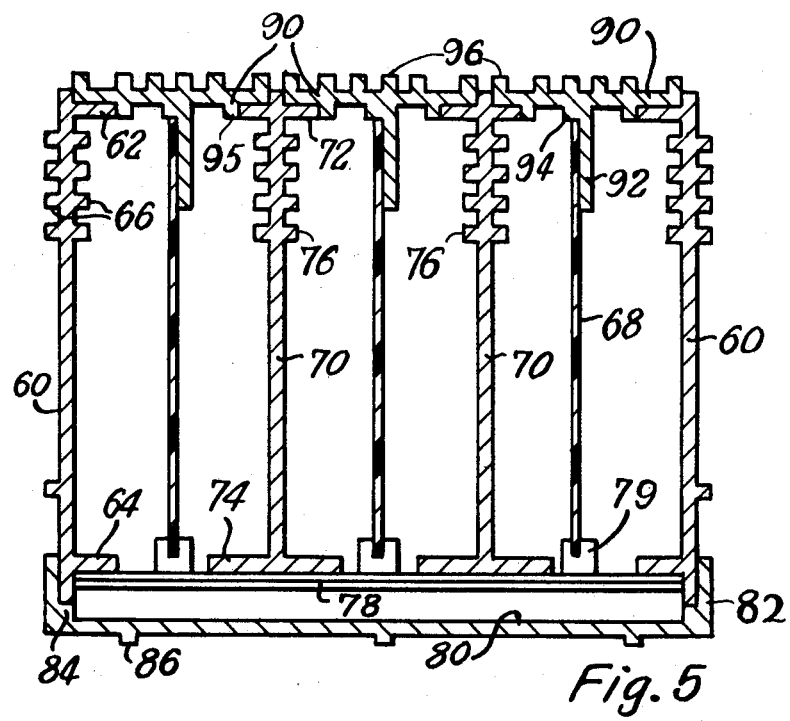
FIG. 5 is a like view of a third system embodying the invention.

Further extrusions are shown in FIG. 5 assembled to make a stereo amplifier module suitable for use in the system of FIG. 1. The module illustrated comprises like outer side extrusions 60 and like inner extrusions 70. The outer extrusions have interiorly directed upper and lower flanges 62 and 64, and cooling ribs 66 on each side. The inner extrusions have upper and lower flanges 72 and 74 extending on both sides and ribs 76. A circuit board 78 is supported from the lower flanges 64, 74 and is enclosed below by a shallow extrusion 80 having upturned side flanges 82 and internal ridges 84 on which rest the lower ends of the side extrusions 60. The module is designed to rest on a solid surface and external ribs 86 on the extrusion 80 provide space for cooling flow of air. Three like extrusions 90 span the gaps between the upper flanges 62, 72 and provide downwardly extending flanges 92 and locating shoulders 94 for circuit boards 68 received below in connection blocks 79 on the board 78. The extrusions 90 are thus generally T-shaped but they can instead be L-shaped and then rest on only a single upper flange. Each extrusion 90 has cooling ribs 96 on its upper surface and locating ribs 96 underneath for abutting the edges of the flanges 62, 72. It will be understood that such a complete module effectively incorporates a cooling system, in which heat is caused to move in reverse direction to the natural convection currents of warm air, because of the temperature difference between the cooling channel or channels formed by the extrusion 80 and the floor of the cabinet, which may be apertured to promote entry of air from outside. Thus hot air rising from the circuit boards heats the upper parts of the module and the heat is conducted downwardly by the extrusions 60 to the extrusion 80 which is at a reference heat potential.

Figure 7:
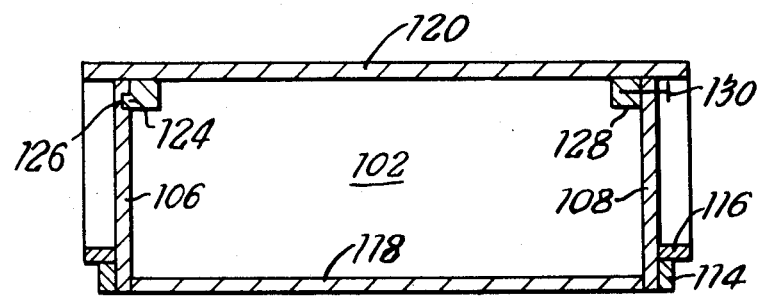
FIG. 7 is a sectional side view of a cabinet which can be included as part of the system of the invention.

To assist screening, a power source may be located at the side of an amplifier module, having for example the structure of FIG. 7, in the manner indicated in FIG. 3.

Obviously many modifications can be made in the extrusions described to suit particular applications which are not of course confined to the field of audio equipment. The use of extrusions in high fidelity audio equipment can be extended to include also an extrusion for edging in a loudspeaker cabinet as shown. The ribbing shown provides a good mechanical key for adhesive. It will be clear from the foregoing that the extrusions described for mounting electronics equiment are inexpensive, light and strong. The electric circuit elements they mount can be readily interchanged as when it is desired to employ a higher power amplifier, or a more versatile selector unit. The circuit elements are well protected mechanically. The extrusions function both as heat sinks and as electrostatic shields, and moreover permit the module, and indeed the whole system to be very readily serviced. No components normally requiring maintenance are located on the module mother board, and none requiring adjustment in use is located on the amplifier or rectifier cards. The whole amplifier module is then plugged into a chassis mother board which carries the interconnections between the different modules. To replace a faulty card, it is simply necessary to remove the lid of the cabinet, which as will be explained subsequently can be very readily done, and remove the relevant top extrusion. A faulty card is thus withdrawn from the module and can be readily replaced by a new one. In the same way a faulty module can be withdrawn from the chassis mother board and replaced by a new module.

The invention will be seen to provide a three dimensional location of the various boards of the electric circuitry with a consequent highly efficient use of the cabinet volume.

As a further assistance in reducing hum in the amplifier output, the various modules incorporate independent star earthing systems for each of the current returns, the signals, and the electrostatic shielding, so that there is substantially no possibility of feeding a mains hum and/or noise component into a signal input. Thus each module has separate earth line to a convenient position external to them all. Minimum lengths of earthing leads are provided for by locating the modules within the cabinet for example as shown in FIG. 1.

The cabinet is regarded as itself a module of the system and comprises a plurality of interfitting readily connectible planar parts which can be preprepared and stacked for use as required. The cabinet preferably has a readily removable lid, and the various printed circuit boards of the electronic modules are mounted in channels formed by metal extrusions, acting both as electrostatic screens and as heat sinks, in such a manner as to make them readily accessible and replaceable once the cabinet lid is removed. The various modules are themselves very compact and are located within the cabinet so as to occupy minimum volume.

As examples of the alternative layouts the invention permits, the adjustable control module or modules can be secured to the front panel of the cabinet, or under the removable lid, or located outside the cabinet in any desired position to suit operational requirements. Moreover the completely assembled cabinet can be disposed in a variety of positions, for example generally vertically or generally horizontally, without limiting the accessibility of the cabinet interior and/or the adjustable and operational controls.

Figure 8:
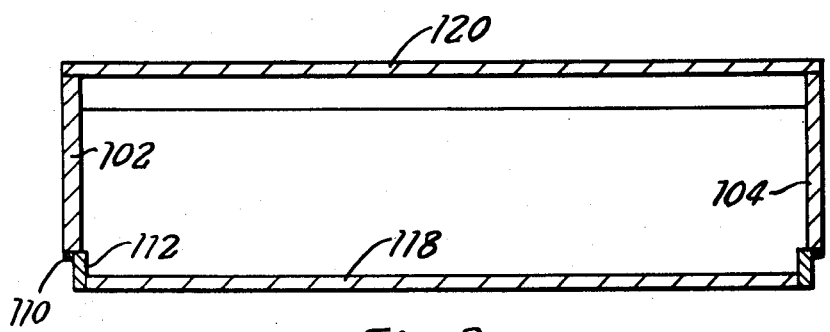
FIG. 8 is a sectional end view of the cabinet of FIG. 7.

The cabinet can be suitably constructed of panels of acrylic plastics material such as perspex secured together by welding or by chloroform or other solvent. A preferred construction shown in FIGS. 7 and 8 comprises a pair of side panels 102, 104 provided on their inner faces with upright grooves for receiving the ends of front and back panels 106, 108 which are apertured to accommodate the various connection devices and control elements. The side panels 102, 104 have along their inner lower edges a step formed by an added square section rod 110 of the material, a foot or plinth section 112 of rectangular shape being received in the step so formed. The front and back panels are stepped at their lower corners to accommodate this structure and carry an added external strip 114 of the material together with a superimposed projecting ledge 116 the depth of the ledge in the front to back direction being equivalent to the extent by which the side panels extend beyond the front and back panels. The front, back and side panels may be of a colour contrasting with that of the lower portions which combine to give the general appearance of a plinth. A floor 118 completes the rigidly connected parts of the cabinet. The floor is at the base of the plinth so that the full volume of this is available for receiving the electronic modules.

It will be noted that this structure provides an inwardly stepped plinth which is not only decorative but which reinforces the cabinet where the weight of the electronic modules is supported. When packaged, the cabinet can be suspended by means of the step, which provides a convenient finger grip for lifting the cabinet in subsequent use.

A lid 120 which is detachable to provide ready access to the whole of the cabinet interior has along the underneath of the front edge thereof a strip providing a forwardly projecting lip 124 underneath at the front for reception in a transverse slot 126 along the top of the inside of the front panel 106. A ridge member 128 secured along the rear edge of the lid 120 abuts the inner side of the back wall 108 and is releasably connected thereto by screws 130 or other fasteners. The lid 108 overlies the side back and front walls and can be in the contrasting colour of the plinth. thus the back, side and front walls may be white and the lid and plinth structure black.

It is also within the invention to eliminate the mechanical selection means used to operate the electronic switching incorporated in the pre-amplifier and/or input modules, and to provide instead for priority insertion and/or omission of any of the different inputs to the system.

A system embodying the invention can moreover integrally incorporate its own means for testing and fault finding and for checking alignment. Such means can include a signal source, measuring and metering means together with suitable switching, as required.

The cabinet may of course be adapted to include a tuner, a record player, or a tape, cassette, or cartridge player, or more than one of these. It will be appreciated that the modules of the system can be prepared and assembled in desired combinations very readily according to demand. In particular, the cabinet panels can be cut and stacked flat and so require little storage space until they are assembled for use.

The equipment is preferably associated with a record player deck comprising a pick-up arm sub-assembly, a record support and drive sub-assembly, and a motor sub-assembly, the sub-assemblies being arranged for operative association through means for eliminating or minimizing transmission responsiveness to acoustic and mechanical vibrations.

Whenever required, it is in accordance with the invention to incorporate the inputs module and the power amplifier module in one unit. In a similar way, it is possible to incorporate the output connection module and the power amplifier in one unit.

The elimination of the manual controls for bass and treble boosting and correction, by adjustment of the gain of the relevant channels, is in accordance with the invention.

The invention thus provides improvements in high fidelity sound reproduction and like systems in respect of convenience and cost of production, compactness, flexibility of physical layout, performance for example as to noise reduction, and ease of maintenance. In particular, the invention permits a manufacturing process which effectively comprises high-efficiency manual procedures, involving essentially assembly type operations, which can be performed on very short and therefore very versatile assembly lines. The basic investment necessary to establish production is extremely small. The systems of the invention are built up from a relatively small number of preprepared units or components which can be themselves be readily produced and conveniently stored for assembly into a variety of systems as the demand for such systems dictates. Stock-keeping is substantially reduced and storage space is efficiently employed. A piece of equipment in accordance with the invention can be physically constructed in a large number of alternative layouts and arrangements. Because the individual units or components can be separately tested before assembly, the rejection rate of the completed systems is reduced almost to nothing.

I claim:

1. A multi-channel amplifier system comprising a cabinet containing signal input means, preliminary signal treatment means, signal amplification means and signal output means, wherein the signal input means and the signal output means are located at a first wall of the cabinet, wherein the preliminary signal treatment means is located at a second wall of the cabinet opposite the first wall and includes an active filter device arranged to divide an input signal extending over at least the major part of the audio frequency range into a plurality of signals extending substantially over a respective part only of the audio frequency range, and wherein the signal amplification means consists of a plurality of separate amplifiers each arranged to amplify less than all of the divided signals and each located with its input adjacent the active filter device and its output adjacent the signal output means.

2. A system according to claim 1, wherein the preliminary signal treatment means comprises a pre-amplifier means extending from the signal input means towards the second wall.

3. A system according to claim 1, wherein the amplifiers each comprises multi-input amplifiers arranged to amplify a plurality of frequency bands.

4. A system according to claim 1, wherein the amplifiers each comprises multi-input amplifiers arranged to amplify portions of a plurality of frequency bands.

5. A system according to claim 1 wherein each amplifier has a respective power transformer.

6. A system according to claim 1, wherein an input signal selector module is mounted adjacent the first wall and includes electronic selector switching controlled from a position at the second wall.

7. A system according to claim 1, wherein the first wall and the second wall are respectively the rear and front walls of a generally rectangular cabinet, the system having a mains power input means adjacent the rear wall.

* * * * *